US010027037B2

(12) United States Patent
Didonato et al.

(10) Patent No.: US 10,027,037 B2
(45) Date of Patent: Jul. 17, 2018

(54) TERMINAL WITH REDUCED NORMAL FORCE

(71) Applicant: TYCO ELECTRONICS CORPORATION, Berwyn, PA (US)

(72) Inventors: Michael Edward Didonato, Harrisburg, PA (US); David Humphrey, Red Lion, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/203,024

(22) Filed: Jul. 6, 2016

(65) Prior Publication Data

US 2018/0013212 A1 Jan. 11, 2018

(51) Int. Cl.
*H05K 1/00* (2006.01)
*H01R 4/48* (2006.01)

(52) U.S. Cl.
CPC .................................... *H01R 4/48* (2013.01)

(58) Field of Classification Search
CPC ........................................ H01R 4/48
USPC ........................................ 439/85
See application file for complete search history.

(56) References Cited

U.S. PATENT DOCUMENTS 2,701,350 A * 2/1955 Soreng ................. H01R 13/115 439/849
3,083,345 A * 3/1963 Scheller ................. H01R 13/28 439/291
3,086,193 A 4/1963 Berg
3,550,067 A * 12/1970 Wallace ............... H01R 13/113 439/682
3,550,069 A * 12/1970 Wladimiro ........... H01R 13/115 439/849
3,660,806 A * 5/1972 De Stephan ......... H01R 13/115 439/849
3,729,701 A * 4/1973 Smith .................. H01R 13/115 439/850
3,976,348 A * 8/1976 Simmons ............... H01R 11/00 439/268

(Continued)

FOREIGN PATENT DOCUMENTS

CN 203503844 U 3/2014
DE 4327808 A1 * 2/1995 ........... H01R 13/115
EP 0142255 A1 5/1985

OTHER PUBLICATIONS

International Search Report, International Application No. PCT/IB2017/053844, International Filing Date Jun. 27, 2017.

*Primary Examiner* — Tulsidas C Patel
*Assistant Examiner* — Peter G Leigh

(57) ABSTRACT

An embodiment is directed to a receptacle terminal for receipt of a mating terminal therein. The receptacle terminal includes a contact portion which has a bottom wall and resilient contact arms. The resilient contact arms extend from opposed sides of the bottom wall. Each of the resilient contact arms has an opening extending therethrough with a first resilient contact section and a second resilient contact section extending on either side of the opening. The first resilient contact sections and the second resilient contact sections have arcuate portions which extend from the bottom wall to mating terminal engaging members. The first resilient contact sections and the second resilient contact sections generate a contact force when a mating terminal is inserted into the terminal.

18 Claims, 3 Drawing Sheets

(56) References Cited

U.S. PATENT DOCUMENTS 4,047,791 A * 9/1977 Carter .................. H01R 13/193 439/828
4,220,388 A * 9/1980 Dechelette ........... H01R 13/115 439/268
RE31,142 E * 2/1983 Simmons ............... H01R 11/00 439/586
4,423,921 A * 1/1984 Hall ..................... H01R 13/115 439/849
4,460,239 A * 7/1984 Inoue ................. H01H 85/2035 439/786
4,534,613 A * 8/1985 Esser ..................... H01R 13/20 439/834
4,632,483 A * 12/1986 Verin ................... H01R 13/114 439/268
4,669,808 A * 6/1987 Owen ..................... F16B 2/245 439/858
4,679,887 A * 7/1987 Jackson ................. H01R 13/20 439/849
4,934,966 A * 6/1990 D'Urso .................. H01R 13/20 439/849
5,122,083 A * 6/1992 Watanabe ............ H01R 13/113 439/787
5,197,906 A * 3/1993 Watanabe ............ H01R 13/113 439/787
5,295,874 A * 3/1994 Yoneda ................ H01R 13/115 439/850
5,733,154 A * 3/1998 Libregts ................. H01R 4/182 439/850
5,899,775 A * 5/1999 Davis ................... H01R 13/428 439/748
5,924,900 A * 7/1999 Davis ................... H01R 13/428 439/748
6,039,615 A * 3/2000 Suzuki ................. H01R 13/113 439/849
6,544,079 B2 * 4/2003 Renkes .................. H01R 13/20 439/848
7,214,109 B2 * 5/2007 Lappohn .............. H01R 13/113 439/851
7,217,161 B1 * 5/2007 Tyler ...................... H01R 4/185 439/748
7,255,614 B1 * 8/2007 Irish ..................... H01R 13/113 439/849
7,595,715 B2 * 9/2009 Pavlovic ............ H01H 85/0417 337/187
7,845,993 B2 * 12/2010 Falchetti .............. H01R 13/113 439/843
9,692,163 B1 * 6/2017 Didonato ................. H01R 4/70
2002/0022412 A1 * 2/2002 Alonson Merino . H01R 13/193 439/849
2005/0287877 A1 * 12/2005 Fukuda ................ H01R 13/187 439/850
2009/0036004 A1 * 2/2009 Bowen ................. H01R 13/115 439/849

* cited by examiner

TERMINAL WITH REDUCED NORMAL FORCE

FIELD OF THE INVENTION

The present invention is directed to a terminal with reduced normal force. In particular, the invention is directed to a socket type terminal in which the curved cantilevered spring beams have a reduced contact spring rate.

BACKGROUND OF THE INVENTION

Socket terminals which are adapted for quick make and break connections with a mating terminal are known. Terminals of this kind are used to make an electrical connection to a male or space terminal which is inserted and frictionally held in the socket terminal. A socket terminal of this type is shown in U.S. Pat. No. 3,086,193.

It is often necessary to disconnect and reconnect such terminals a number of times, for example, for testing purposes prior to final inspection and shipment of the product on which such terminals are used. It is also required that the connection made with such terminals be maintained under conditions of vibration and possible strain in subsequent service. Traditionally, these terminals have a high insertion mating force which is not desirable, causing ergonomic problems with insertion when a mating connector is inserted into the socket terminal.

It would, therefore, be beneficial to provide a socket type terminal which has contact springs which have a reduced contact spring rate, thereby allowing the contact normal force to be more accurately controlled with the same manufacturing tolerances. More controlled normal force allows for a minimum contact normal force to be reliably maintained while reducing the insertion force required during mating.

SUMMARY OF THE INVENTION

An object is to provide a socket type terminal in which the curved cantilevered spring beams have a reduced contact spring rate, thereby allowing the contact normal force to be more accurately controlled with the same manufacturing tolerances. More controlled normal force allows for a minimum contact normal force to be reliably maintained while reducing the insertion force required during mating.

An object is to provide a socket type terminal which provides a stable electrical connection while allowing for a lower insertion force of the mating terminal into the socket terminal.

An embodiment is directed to a receptacle terminal for receipt of a mating terminal therein. The receptacle terminal includes a contact portion which has a bottom wall and resilient contact arms. The resilient contact arms extend from opposed sides of the bottom wall. Each of the resilient contact arms has an opening extending therethrough with a first resilient contact section and a second resilient contact section extending on either side of the opening. The first resilient contact sections and the second resilient contact sections have arcuate portions which extend from the bottom wall to mating terminal engaging members. The first resilient contact sections and the second resilient contact sections generate a contact force when a mating terminal is inserted into the terminal.

An embodiment is directed to a receptacle terminal for receipt of a mating terminal therein. The receptacle terminal includes a contact portion which has a bottom wall and resilient contact arms. The resilient contact arms extend from opposed sides of the bottom wall. Each of the resilient contact arms has an opening extending therethrough with a first resilient contact section and a second resilient contact section extending on either side of the opening. The first resilient contact sections and the second resilient contact sections have arcuate portions which extend from the bottom wall to mating terminal engaging members. The first resilient contact sections and the second resilient contact sections generate a contact force when a mating terminal is inserted into the terminal. Mating terminal engagement surfaces of the mating terminal engaging members are positioned at a top of a mating slot, the resilient contact arms providing the resiliency allowing the mating terminal engaging members to move relative to the bottom wall as the mating terminal is inserted into the mating slot.

An embodiment is directed to a receptacle terminal for receipt of a mating terminal therein. The receptacle terminal includes a contact portion which has a bottom wall and resilient contact arms. The resilient contact arms extend from opposed sides of the bottom wall. Each of the resilient contact arms has an opening extending therethrough with a first resilient contact section and a second resilient contact section extending on either side of the opening. The first resilient contact sections and the second resilient contact sections have different sizes and extend from the bottom wall to mating terminal engaging members. The first resilient contact sections and the second resilient contact sections generate a contact force when a mating terminal is inserted into the terminal. Mating terminal engagement surfaces of the mating terminal engaging members are positioned at a top of a mating slot, the resilient contact arms providing the resiliency allowing the mating terminal engaging members to move relative to the bottom wall as the mating terminal is inserted into the mating slot. The mating terminal engagement surfaces have an arcuate configuration.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
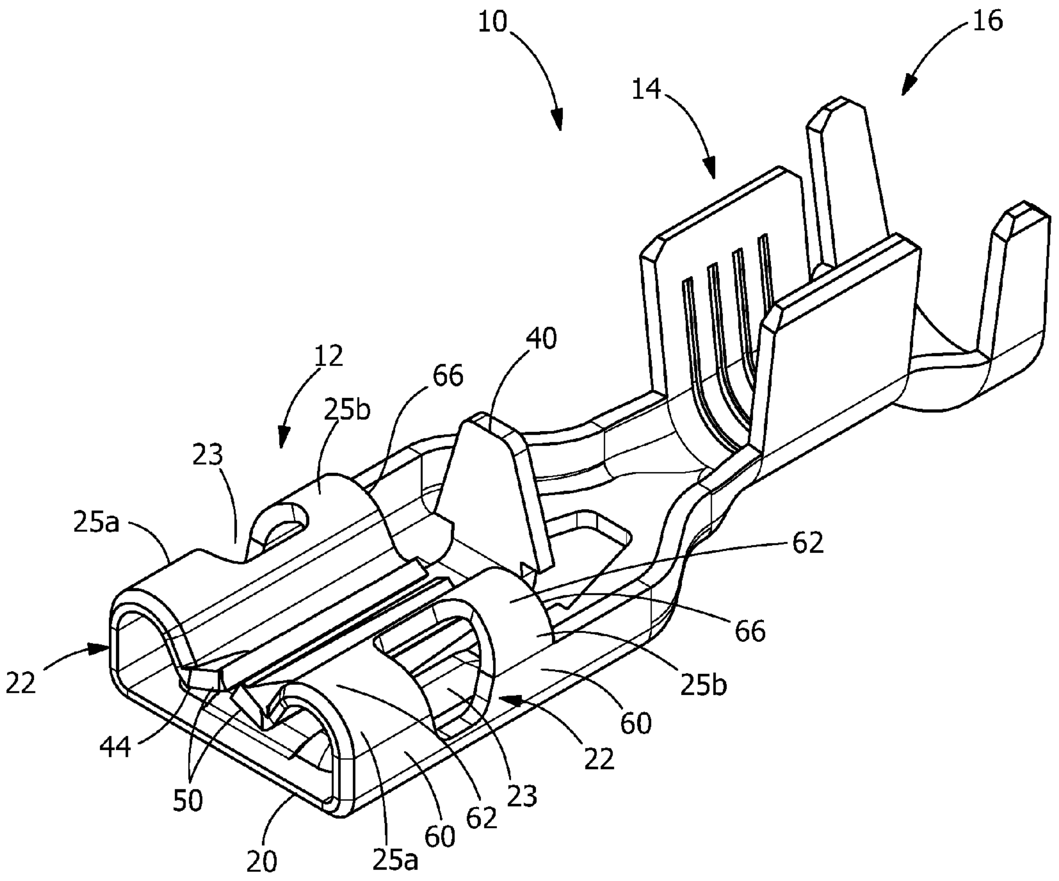
FIG. 1 is perspective view of an illustrative embodiment of the terminal according to the present invention.
Figure 2:
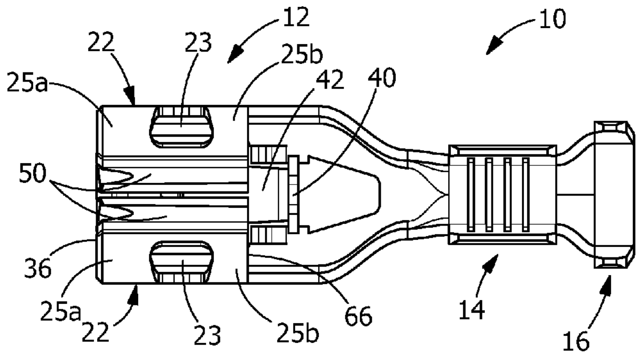
FIG. 2 is a top view of the terminal of FIG. 1.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as “lower,” “upper,” “horizontal,” “vertical,” “above,” “below,” “up,” “down,” “top” and “bottom” as well as derivative thereof (e.g., “horizontally,” “downwardly,” “upwardly,” etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

As best shown in FIGS. 1 through 4, a receptacle, socket or female terminal 10 includes a contact portion 12, a wire barrel 14 behind the contact portion 12 and an insulation barrel 16 behind the wire barrel 14. The wire barrel 14 is configured for crimped connection with an end of a conductive core of an insulated wire. The insulation barrel 16 is configured for crimped connection with an end of the insulation coating or jacket of the wire. Although a wire barrel 14 and an insulation barrel 16 are shown, the contact portion 12 can be used with other types of termination members without departing from the scope of the invention. In the illustrative embodiment shown, the terminal 10 is stamped and formed from a metal plate having a good electrical conductivity.

Figure 5:
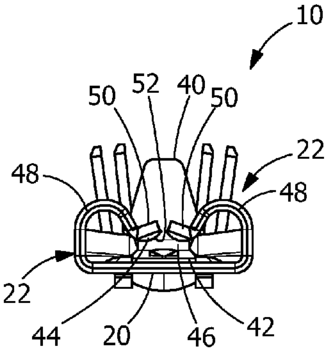
FIG. 5 is a front view of the terminal of FIG. 1.
Figure 3:
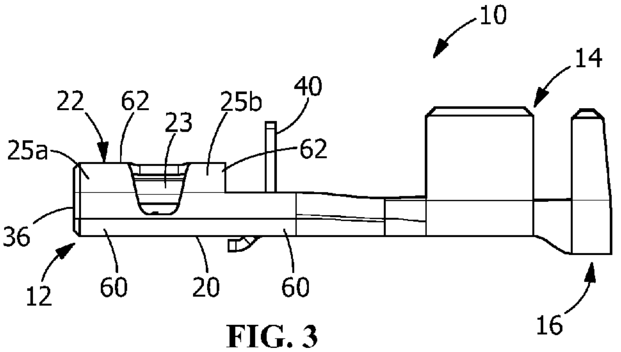
FIG. 3 is a side view of the terminal of FIG. 1.
Figure 4:
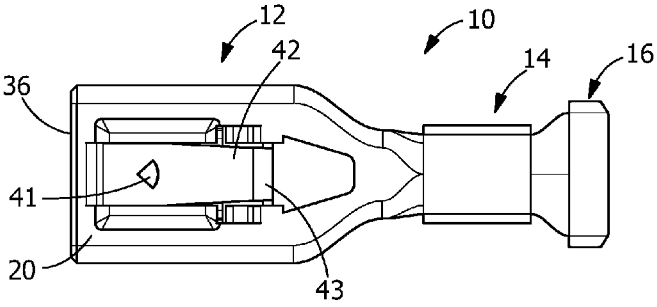
FIG. 4 is a bottom view of the terminal of FIG. 1.
Figure 6:
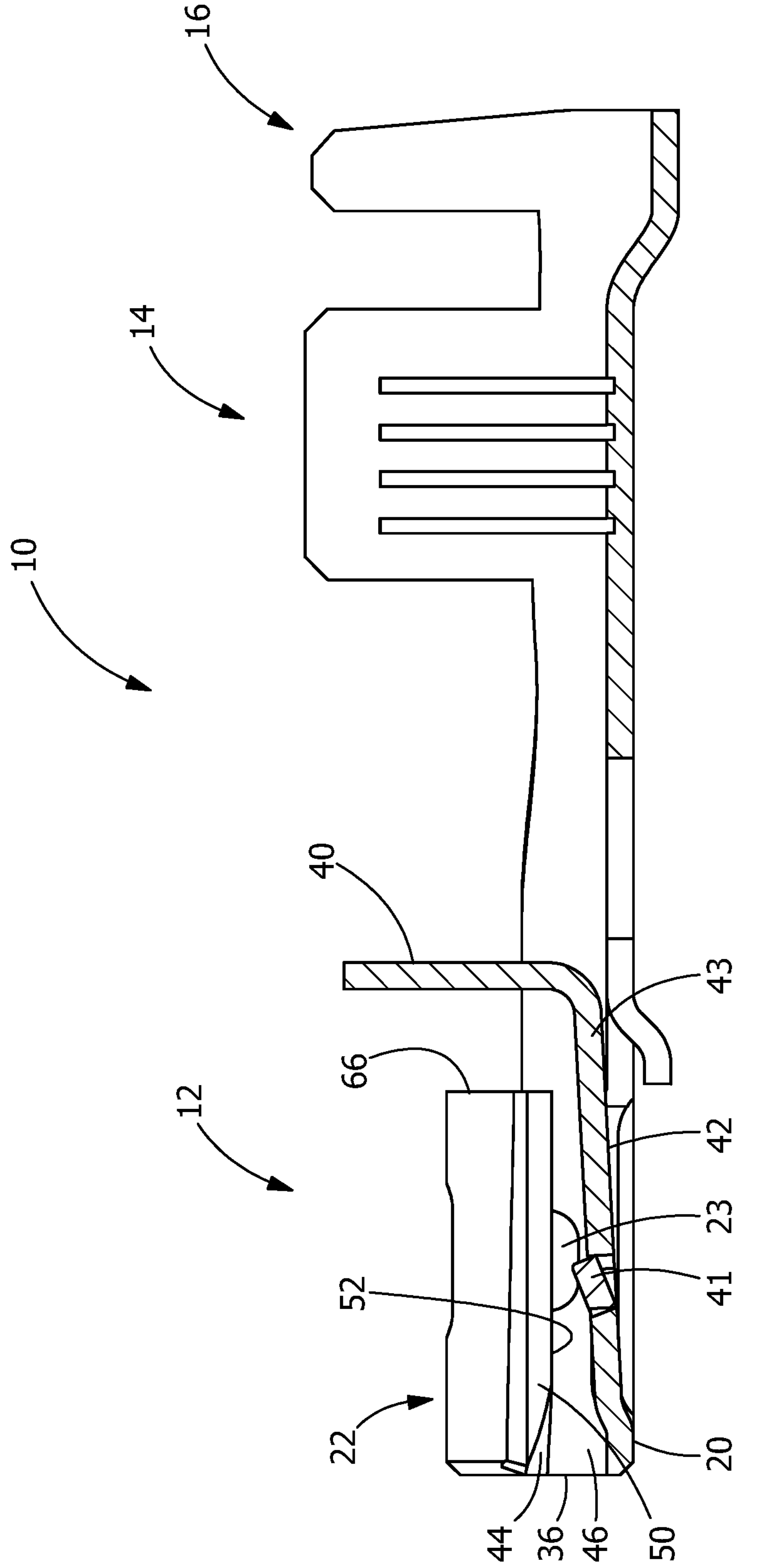
FIG. 6 is a cross-sectional view of the terminal of FIG. 2.

Referring to FIGS. 1, 5 and 6, the contact portion 12 includes a bottom wall 20 and resilient contact arms 22 which extend from either side 24, 26 of the bottom wall 20. As best shown in FIG. 6, the bottom wall 20 has a spring arm 42 provided thereon. The spring arm 42 is stamped and formed form the bottom wall 20.

The spring arm 42 extends from the bottom wall 20 to create a raised portion or arm extending from the inner surface of the bottom wall 20 toward the resilient arms 22. The spring arm 42 includes a projection or embossment, such as, but not limited to, a detent, dimple or lance 41 (as best shown in FIG. 6) which is formed from the spring arm 42 to create a raised area on an inner surface of the spring arm 42. The lance 41 engages the mating terminal as the mating terminal is inserted into the terminal 10, as will be more fully described below.

In the illustrative embodiment shown, each resilient arm 22 has an opening or cutout 23 with a first resilient contact section 25*a* and a second resilient contact section 25*b* extending on either side of the opening 23. The first resilient contact section 25*a* is positioned proximate a mating end 36 of the contact portion 12. The second resilient contact section 25*b* is removed from the mating end 36 toward the wire barrel 14. The openings extend between and separate the resilient contact sections 25*a*, 25*b*. In the embodiment shown, the openings 23 are formed by removing material from a blank prior to forming the terminal. The material removed can be reused in the manufacture of additional terminals. Other methods for forming the openings 23 may be used without departing from the scope of the invention.

As best shown in FIG. 5, the resilient contact sections 25*a*, 25*b* have arcuate or curled portions which extend from the bottom wall 20 to a mating terminal engaging member 50. In one illustrative embodiment, one or all of the resilient contact sections 25*a*, 25*b* may have a tapered or trapezoidal configuration, whereby the width of the respective arm at the root or base 60 (FIG. 3), which connects to bottom wall 20, is greater than the width of portion 62 (FIG. 3) of the respective arm proximate the mating terminal engaging member 50. However, other configurations can be used. The configuration of each respective contact section 25*a*, 25*b* of the resilient contact arms 22 allows the stiffness and spring rate of each respective resilient contact section 25*a*, 25*b* and the resilient contact arms 22 to be controlled. A wider root or base 60 allows for a higher spring rate and for a more even distribution of forces from the respective resilient contact sections 25*a*, 25*b* to the bottom wall 20. Conversely, the more narrow the respective resilient contact sections 25*a*, 25*b*, the lower the spring rate of the arm and the lower the effective spring rate of the resilient contact arms 22. Consequently, the respective resilient contact sections 25*a*, 25*b* may each be configured to generate a different contact force, resulting in different contact forces for the resilient contact arms 22.

In various illustrative embodiments, resilient contact sections 25*b* have a back surface or edge 66 which extends in a direction which is essentially perpendicular to the longitudinal axis of the terminal 10. This provides a reference surface which can be used when positioning the terminal 10 in a housing or when mating the mating terminal to the terminal 10.

The mating terminal engagement members 50 of the resilient contact arms 22 extend from the resilient contact sections 25*a*, 25*b* and span opening 23. In the illustrative embodiment shown, the mating terminal engagement members 50 are asymmetrical, having lead-in surfaces 44 positioned proximate the mating end 36. The lead-in surfaces 44 are provided to prevent the stubbing of the mating contact on the edge of the resilient arms 22 and to help guide the mating terminal into a mating slot 46 of the contact portion 12 and to reduce the insertion force required to insert the mating terminal into the slot 46. A mating terminal engagement surface 52 is provided on each mating terminal engaging member 50. In the embodiment shown, the mating terminal engaging member 50 extends from the resilient contact arms 22, positioning the mating terminal engagement surface 52 at the top of the mating slot 46. The configuration of the resilient contact arms 22 provide the resiliency needed to allow the mating terminal engaging member 50 to move relative to the bottom wall 20 as the mating terminal is inserted into the slot 46. As best shown in FIG. 5, the mating terminal engagement surfaces 52 have an arcuate or rounded configuration. However, other configurations of the engagement surfaces 52 may be used.

In the illustrative embodiment shown, the spring arm 42 is stamped and formed from the bottom wall 20. The spring arm 42 is formed to allow a free end 43 thereof to move or be resiliently deformed relative to the bottom wall 20, allowing the spring arm 42 and the lance 41 to move toward and away from the mating terminal engaging member 50.

In the illustrative embodiment shown, the spring arm 42 has an end wall 40 provided thereon. The end wall 40 extends from the spring arm 42 to create a stop portion which extends from the inner surface of the spring arm 42 toward the mating terminal engaging member 50. The end wall 40 is provided to limit the distance the mating terminal can be inserted into the slot 46.

The configuration of the resilient contact arms 22 and the spring arm 42 allows the contact portion 12 to compensate for any slight misalignment of the mating terminal or any slight warpage or imperfections associated with the mating terminal.

A terminal according to the teaching of the invention has a lower spring rate than known terminals. By controlling the space and size of the contact sections 25*a*, 25*b* and the openings 23, the normal forces and insertion forces of the resilient contact arms 22 can be controlled, while allowing for a proper electrical connection between the terminals 10 and the mating terminals. For example, the insertion force of a terminal made according to the present invention may be reduced in comparison to a terminal without individual contact sections 25*a*, 25*b* separated by openings 23.

In addition, as the spring rate is reduced, the resilient arms 22 allow for a greater spring deflection before taking a permanent set. This allows the terminal to be used with mating terminals which have some variance in manufacturing tolerances. In other words, because the resilient arms 22 have the ability to deflect a greater distance without taking a permanent set, the thickness of the mating terminal does not have be as precisely controlled.

In a fully inserted position, the lance 41 of the spring arm 42 and the mating terminal engagement surfaces 52 are all provided in electrical and mechanical contact with the mating terminal. The multiple areas of contact allow the receptacle contact 10 to be used in applications in which higher current levels, such as, but not limited to, 15 to 20 or more amps. The configuration of the spring arm 42 and mating terminal engagement surfaces 52 provides a stable and reliable electrical connection between the mating terminal and the terminal 10. The configuration of the lance 41 of the spring arm 42 and mating terminal engagement surfaces 52 provide for higher hertzian stresses, thereby eliminating or minimizing the fretting corrosion between the terminal 10 and the mating terminal, thereby providing a stable and reliable electrical connection between the mating terminal and the terminal 10.

The cooperation of the lance 41 and the mating terminal engagement surfaces 52 are spaced laterally relative to each other, allowing the connection between the mating terminal and the receptacle terminal 10 to be stable in all environments, thereby insuring that the mating terminal will remain properly positioned in the receptacle terminal 10 as vibration occurs.

As the lance 41 of the spring arm 42 and the mating terminal engagement surfaces 52 are laterally offset from each other, the receptacle terminal 10 provides multiple contact areas even if the mating terminal is bent. In addition, the multiple contact areas resist twisting or misalignment of the mating terminal.

In one embodiment, the resilient arms 22 and are configured such that the contact areas of the mating terminal engagement surfaces 52 generate an equal and opposite force to resist the force generated by the lance 41 of the spring arm 42. In addition, the resilient arms 22 and are configured such that the contact areas of the lance 41 of the spring arm 42 generate an equal and opposite force to resist the force generated by the mating terminal engagement surfaces 52. However, the configuration of the resilient arms 22 may be varied to allow the contact areas to have varied forces associated therewith. In particular, the positioning of the lance 41 of the spring arm 42 can alter the force applied by each contact area.

The configuration of the resilient contact arms 22 and the spring arm 42 and the use of multiple contact areas allows for a lower normal force during mating and unmating of the mating terminal from the receptacle contact 10. This allows the mating terminal and receptacle contact 10 to be more durable over numerous cycles, as there is less plating wear due to the lower mating or normal forces. The number of contact areas also allows the receptacle contact 10 to be used at higher current levels, as the number of contact areas allows the extreme heat associated with the high current levels to be dispersed, thereby preventing welding of the contact asperities.

The terminal of the present invention has resilient contact arms which have a reduced contact spring rate, thereby allowing the contact normal force to be more accurately controlled with the same manufacturing tolerances. More controlled normal force allows for a minimum contact normal force to be reliably maintained while reducing the insertion force required during mating. The resilient contact arms provide a stable electrical connection while allowing for a lower insertion force of the mating terminal into the socket terminal.

While the invention has been described with reference to a preferred embodiment, it will be understood by those skilled in the art that various changes may be made and equivalents may be substituted for elements thereof without departing from the spirit and scope of the invention of the invention as defined in the accompanying claims. In particular, it will be clear to those skilled in the art that the present invention may be embodied in other specific forms, structures, arrangements, proportions, sizes, and with other elements, materials, and components, without departing from the spirit or essential characteristics thereof. One skilled in the art will appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A receptacle terminal for receipt of a mating terminal therein, the receptacle terminal having a contact portion comprising:

a bottom wall with resilient contact arms extending from opposed sides of the bottom wall;

each of the resilient contact arms having an opening extending therethrough with a first resilient contact section and a second resilient contact section extending on either side of the opening;

the first resilient contact sections and the second resilient contact sections having arcuate portions which extend from the bottom wall to mating terminal engaging members;

the mating terminal engagement members extend from the first resilient contact sections across the openings and to the second resilient contact sections;

the first resilient contact sections and the second resilient contact sections have trapezoidal configurations with widths proximate the bottom wall which are greater than widths proximate the mating terminal engaging members, the first resilient contact sections and the second resilient contact sections generating a contact force when a mating terminal is inserted into the terminal.

2. The terminal as recited in claim 1, wherein a spring arm extends from the bottom wall.

3. The terminal as recited in claim 2, wherein a projection is formed from the spring arm of the bottom wall, the projection extends from the spring arm toward the mating terminal engagement members to create a raised area on an inner surface of the spring arm.

4. The terminal as recited in claim 1, wherein the first resilient contact sections and the second resilient contact sections have different sizes.

5. The terminal as recited in claim 1, wherein the first resilient contact sections and the second resilient contact sections have widths proximate the bottom wall which are the same size.

6. The terminal as recited in claim 1, wherein the first resilient contact sections are positioned proximate a mating end of the contact portion.

7. The terminal as recited in claim 1, wherein the mating terminal engaging members extend from the resilient contact arms toward the bottom wall, mating terminal engagement surfaces of the mating terminal engaging members are positioned at a top of a mating slot, the resilient contact arms provide the resiliency to allow the mating terminal engaging members to move relative to the bottom wall as the mating terminal is inserted into the mating slot.

8. The terminal as recited in claim 7, wherein a width of the first resilient contact sections proximate the bottom wall is greater than a width of the first resilient contact sections proximate the mating terminal engaging member.

9. The terminal as recited in claim 7, wherein a width of the second resilient contact sections proximate the bottom wall is greater than a width of the second resilient contact sections proximate the mating terminal engaging member.

10. The terminal as recited in claim 7, wherein the mating terminal engagement surfaces have an arcuate configuration.

11. The terminal as recited in claim 7, wherein the mating terminal engaging members have lead-in surfaces provided to help guide the mating terminal into the mating slot.

12. A receptacle terminal for receipt of a mating terminal therein, the receptacle terminal having a contact portion comprising:

a bottom wall with resilient contact arms extending from opposed sides of the bottom wall;

each of the resilient contact arms having an opening extending therethrough with a first resilient contact section and a second resilient contact section extending on either side of the opening;

the first resilient contact sections and the second resilient contact sections having arcuate portions which extend from the bottom wall to mating terminal engaging members;

the first resilient contact sections and the second resilient contact sections have trapezoidal configurations widths proximate the bottom wall which are greater than widths proximate the mating terminal engaging members, the first resilient contact sections and the second resilient contact sections generating a contact force when a mating terminal is inserted into the terminal;

the mating terminal engagement members extend from the first resilient contact sections across the openings and to the second resilient contact sections, mating terminal engagement surfaces of the mating terminal engaging members are positioned at a top of a mating slot, the resilient contact arms providing the resiliency allowing the mating terminal engaging members to move relative to the bottom wall as the mating terminal is inserted into the mating slot.

13. The terminal as recited in claim 12, wherein an embossment is formed from a spring arm of the bottom wall, the embossment extends from the spring arm to create a raised area on an inner surface of the spring arm.

14. The terminal as recited in claim 12, wherein at least one of the first resilient contact sections and the second resilient contact sections has a width proximate the bottom wall which is greater than a width of proximate the mating terminal engaging member, wherein the width proximate the bottom wall distributes forces to the bottom wall.

15. The terminal as recited in claim 12, wherein the first resilient contact sections and the second resilient contact sections have different sizes.

16. The terminal as recited in claim 12, wherein the first resilient contact sections and the second resilient contact sections have widths proximate the bottom wall which are the same size.

17. The terminal as recited in claim 12, wherein the mating terminal engagement surfaces have an arcuate configuration.

18. A receptacle terminal for receipt of a mating terminal therein, the receptacle terminal having a contact portion comprising:

a bottom wall with resilient contact arms extending from opposed sides of the bottom wall;

each of the resilient contact arms having an opening extending therethrough with a first resilient contact section and a second resilient contact section extending on either side of the opening;

the first resilient contact sections and the second resilient contact sections have different sizes, the first resilient contact sections and the second resilient contact sections extending from the bottom wall to mating terminal engaging members, the first resilient contact sections and the second resilient contact sections have tapered or trapezoidal configurations with widths proximate the bottom wall which are greater than widths proximate the mating terminal engaging members;

the mating terminal engagement members extend from the first resilient contact sections across the openings and to the second resilient contact sections, mating terminal engagement surfaces of the mating terminal engaging members are positioned at a top of a mating slot, the resilient contact arms providing the resiliency allowing the mating terminal engaging members to move relative to the bottom wall as the mating terminal is inserted into the mating slot, the mating terminal engagement surfaces have an arcuate configuration.

* * * * *